United States Patent [19]

Ueno

[11] Patent Number: 4,839,540
[45] Date of Patent: Jun. 13, 1989

[54] TRI-STATE OUTPUT CIRCUIT
[75] Inventor: Masaji Ueno, Yokohama, Japan
[73] Assignee: Kabushiki Kaisha Toshiba, Kawasaki, Japan
[21] Appl. No.: 176,245
[22] Filed: Mar. 31, 1988
[30] Foreign Application Priority Data Mar. 31, 1987 [JP] Japan ................... 62-76474

[51] Int. Cl.⁴ ............... H03K 19/017; H03K 17/16; H03K 19/094; H03K 19/092
[52] U.S. Cl. ................... 307/473; 307/446; 307/448; 307/451; 307/570
[58] Field of Search ............ 307/473, 446, 448, 451, 307/570, 315

[56] References Cited

U.S. PATENT DOCUMENTS

| | | | |
|---|---|---|---|
| 3,515,901 | 6/1970 | White | 307/446 |
| 4,280,065 | 7/1981 | Minato et al. | 307/473 |
| 4,678,943 | 7/1987 | Uragami et al. | 307/473 |
| 4,725,982 | 2/1988 | Hara et al. | 307/473 |

Primary Examiner—Stanley D. Miller
Assistant Examiner—Nancy Thai
Attorney, Agent, or Firm—Foley & Lardner, Schwartz, Jeffery, Schwaab, Mack, Blumenthal & Evans

[57] ABSTRACT

A tri-state output circuit comprising an input section having complementary field effect transistors which constitute NOR gate and investor circuits, a control section having first and second current control circuits, and an output section having bipolar transistors wherein an input signal and a tri-state signal are logically processed in the input section and its result applied to the control section. Then, the switching operations of the output section and a high impedance condition of the output terminal of the tri-state output circuit are controlled by the control section consisting of a plurality of complementary FETs, thereby achieving a low power consumption, a high load driving capability, and a high speed operation.

10 Claims, 1 Drawing Sheet

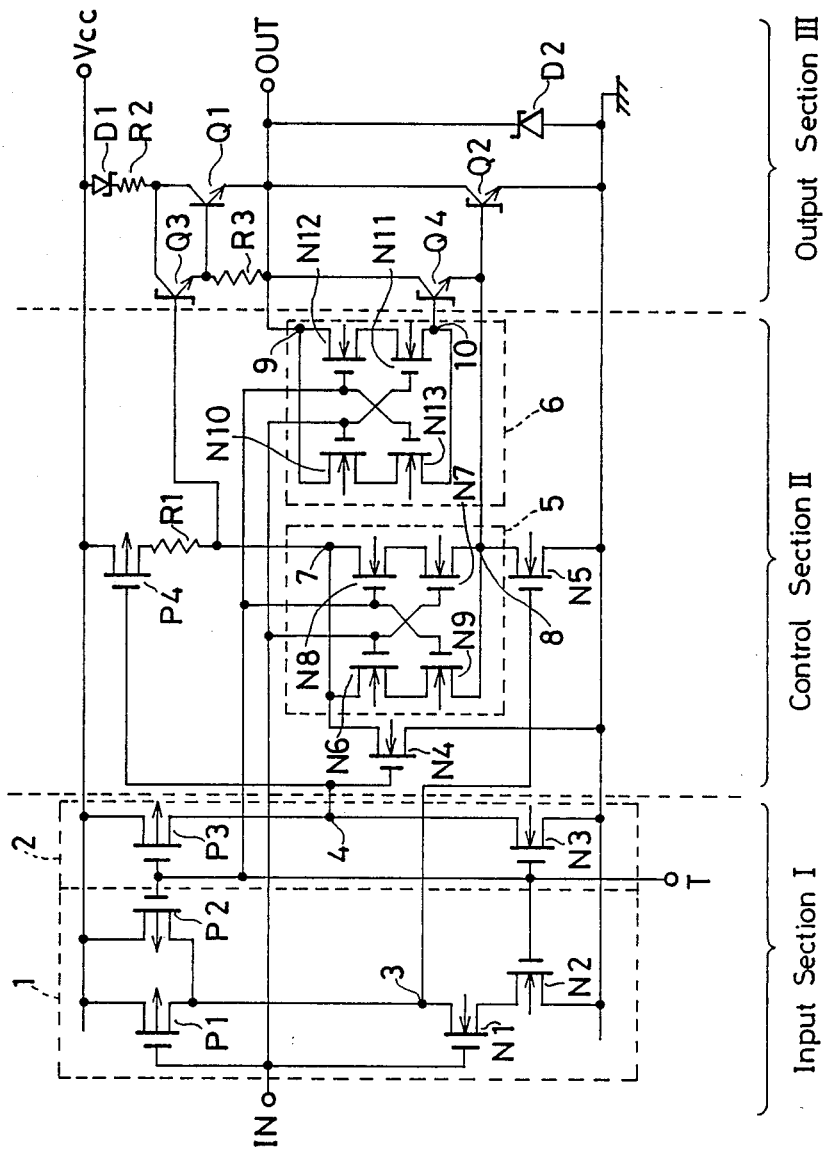

TRI-STATE OUTPUT CIRCUIT

BACKGROUND OF THE INVENTION

1. Field of the Invention

The present invention relates to a tri-state output circuit using bipolar transistors and complementary field effect transistors, and is operable with low power consumption, high load driving capability and at high speed.

2. Description of the Prior Art

Various types of tri-state output circuits are known heretofore which can take three output conditions, i.e., high and low level conditions and a high impedance condition at the output terminal of the circuit. These tri-state output circuits include a TTL circuit construction using bipolar transistors and a CMOS circuit construction using CMOS transistors, which are one kind of complementary FET (field effect transistor).

When the tri-state output circuit is constructed with a TTL circuit construction, a circuit having a high load driving capability and operable at high speed can be realized due its large transfer conductance, which is one feature of bipolar transistors.

In the TTL circuit construction, however, an electric current flows through the circuit even when it is in a steady state, which results in an increase in power consumption. If an attempt is made to reduce the current flow through the circuit in this case, in order to reduce the power consumption, its high speed operability will be lowered.

On the other hand, when the tri-state output circuit is constructed with a CMOS circuit construction, the power consumption can be reduced. However, since the transfer conductance of MOS transistors is small, compared with that of bipolar transistors, the load driving capability is decreased, which in turn results in a detrimental effect in the high speed operation of the circuit.

When an attempt is also made to increase the driving capability of the circuit as well as to realize a high speed operation in this case by increasing the size of the transistors, the circuit has to be large. This will bring about an adverse effect in view of the miniturization of integrated circuits.

In addition, if the size of the transistors in the output stage is increased, the ON-time resistance of the transistors is decreased. As a result, when the output signal is either overshot or undershot, the ON-time resistance of the transistors can no longer absorb the overshoot or the undershoot of the output signal in a resonance circuit, which contains an inductance component of the wiring leads connected to the output terminal and a capacitance component of a load, thereby producing the "ringing". This will bring about, in the worst case, a malfunction.

Accordingly, in both cases of the TTL circuit construction and of the CMOS circuit construction, according to the prior art, it was difficult to realize a tri-state output circuit with a low power consumption, a high load driving capacity, and a high speed operation as well as the ability to suppress the ringing phenomena.

SUMMARY OF THE INVENTION

It is therefore an object of the present invention to provide a tri-state output circuit having low power consumption, high load driving capability, and being capable of performing high speed operation as well as preventing the ringing phenomena of the output signal.

It is another object of the present invention to provide a tri-state output, circuit in which the input section and control section are comprised of comlementary field effect transistors, and tri-state output signals are obtainable by controlling the switching operations of the output transistors, consisting of bipolar transistors, as well as controlling the high impedance condition at the output terminal of the tri-state output circuit, thereby suppressing ringing of the output signal, as well as achieving a high speed operation of the circuit.

One feature of the tri-state output circuit according to the present invention resides in the provisions of an input section having a NOR gate circuit receptive of an input signal and a tri-state signal for taking a NOR logical sum, and an invertor circuit receptive of the tri-state signal for producing an inverted signal thereof, each of the circuits consisting of a plurality of complementary field effect transistors; a control section having a first type first field effect transistor and a second type second field effect transistor, each of gate terminals thereof being commonly connected to the output terminal of the inverter circuit, each of the source terminals thereof being connected to either a power supply or to the ground potential respectively, a second type third field effect transistor having its gate terminal being connected to an output terminal of the NOR gate circuit and its source being connected to the ground potential, a first electric current control circuit having a plurality of second type field effect transistors coupled to the first, second and third field effect transistors as well as the input and tri-state terminals, and a second electric current control circuit having a plurality of second type field effect transistors, each gate of the transistors being connected to either the input terminal or to the tri-state terminal respectively; and an output section having first and second output transistors, and third and fourth transistors, the third transistor being Darlington-connected to the first output transistor, with its base terminal connected to one of the junction points of the first electric current control circuit, and the fourth transistor being Darlington-connected to the second output transistor, with its base terminal connected to one of the junction points of the second electric current control circuit.

These and other objects, features and advantages of the invention will be apparent from the following detailed description of the invention with reference to the accompanying drawings.

BRIEF DESCRIPTION OF THE DRAWINGS

The single drawing shows one embodiment of the tri-state output circuit according to the present invention.

DETAILED DESCRIPTION OF THE PREFERRED EMBODIMENTS

A single FIGURE indicates one embodiment of the tri-state output circuit according to the present invention.

The tri-state output circuit consists of an input section I for receiving an input signal and a tri-state signal, the input section I being consisted of a plurality of conplementary types of P-channel and N-channel field effect transistors (FETs), a control section II for receiving an output signal from the input section I, which also consisted of the P-channel and N-channel FETs, and an output section III for producing an inverted output of the input signal and a high impedance output condition, which consists of NPN transistors and which is controlled by the control section II.

The input section I more specifically comprises a NOR gate 1 for taking a NOR logical sum of the input signal and tri-state signal, and an invertor 2 for producing an inverted output of the tri-state signal.

The NOR gate 1 comprises the P-channel FET P1 and the N-channel FET N1, with each of the gate terminals commonly connected to the input terminal IN to which the input signal is applied and P2 and N2, with each of the gate terminals applied by the tri-state signal. The P1 and P2 are connected in parallel between the power supply $V_{CC}$ and the output terminal 3 of the NOR gate 1, while N1 and N2 are connected in series between the output terminal 3 and the ground (potential).

The invertor 2 comprises P3 and N3, with each of the gate terminals commonly connected to the tri-state terminal T to which the tri-state signal is applied. P3 is connected between the power supply $V_{CC}$ and the output terminal 4 of the invertor while N3 is connected between the output terminal 4 and the ground.

The control section II comprises P4, N4, N5, a first current control circuit 5 and a second current control circuit 6. P4 and N4 have each gate terminal commonly connected to the output terminal 4 of the invertor 2 and each source terminal connected to either the $V_{CC}$ or the ground, respectively. N5 has its gate terminal connected to the output terminal 3 of the NOR gate 1 and its source terminal connected to the ground.

The first current control circuit 5 comprises N6 and N7, with each gate terminal connected to the input terminal IN, and N8 and N9 with each gate terminal connected to the tri-state terminal T. N6 and N9, and N8 and N7 are connected in series respectively, while N6 and N7 and N8 and N9 each are connected in parallel. One junction point connected to the drain terminal of P4 through a resistor R1, while the other junction point 8 is connected to the drain terminal of N5.

The second current control circuit 6 likewise comprises N10, N11, N12 and N13 similar to the first current control circuit 5 and the junction points 9 and 10 are connected to transistors which constitute the output section III which will be described later.

The output section III comprises a NPN type output transistor Q1 and a Schottky barrier NPN type output transistor Q2, a Schottky barrier NPN type transistor Q3 with its collector Darlington-connected with the output transistor Q1 and its base connected to the junction point 7 of the first current control circuit 7, and the Schottky barrier NPN type transistor Q4 with its collector Darlington-connected with the output transistor Q2 and its base connected to the junction point 10 of the second current control circuit 6.

The output transistor Q1 has its collector terminal connected to the power supply $V_{CC}$ through a Schottky barrier type diode D1 and a current limiting resistor R2, its emitter connected to the output terminal OUT which produces an inverted signal of the input signal and which takes a high impedance condition, and its base connected to the emitter terminal of the transistor Q3 and through a resistor R3 to the junction point 9 of the second current control circuit 6.

The output transistor Q3 has its base terminal connected to the junction point 8 of the first current control circuit 5, its collector terminal connected to the output terminal OUT, and its emitter connected to the ground. The output section III comprises a Schottky barrier type diode D2 connected between the ground and the output terminal OUT so as to give a forward direction from the ground to the output terminal.

The operation of the tri-state output circuit according to the present invention will now be made.

First of all, when the tri-state signal applied to the tri-state terminal T is the normal mode of high level condition, i.e., an inverted signal of the input signal is produced at the output terminal OUT, the operation becomes as follows;

When the tri-state signal is in the high level condition, N3, N8, N9, N12, and N13 are rendered conductive while P2 and P3 are rendered non-conductive, thereby rendering P4 conductive and N4 non-conductive. In these conditions, when a low level input signal is applied to the input terminal IN, N6 and N7 are rendered non-conductive, so that an electric current flows into the base terminal of the transistor Q3 through P4 and the resistor R1 from the power supply $V_{CC}$, thereby rendering the transistor Q3 and the output transistor Q1 conductive.

Also, when the input signal is in the low level condition, N10 and N11 are rendered conductive while N1 is rendered non-conductive. As a result, N5 is rendered conductive, so that the transistors Q4 and the output transistor Q2 are rendered non-conductive. Consequently, a current flows from the power supply $V_{CC}$ to the output terminal OUT through the current limiting resistor R2 and the output transistor Q1, thereby rendering the output terminal OUT a high level condition and producing an inverted signal of the input signal at the output terminal OUT.

Now, when a high level input signal is applied to the input terminal IN, N6 and N7 are rendered conductive, which in turn renders N2 conductive and also renders N5 non-conductive. As a result, a current flows into the base of the output transistor Q3 from the power supply $V_{CC}$ through P4 and the resistor R1 as well as N8 and N7, thereby rendering the transistor Q3 conductive.

On the other hand, as current is applied to the base of the output transistor Q3, the base potential of the transistor Q3 becomes $V_{BE}$, i.e., the base-emitter voltage of the transistor Q2, thereby rendering the transistor Q3 non-conductive and rendering the output transistor Q1 non-conductive. As a result, an electric current flows from the output terminal OUT towards the ground through the transistor Q2, thereby rendering the output terminal a low level condition and producing an inverted signal of the input signal from the output terminal OUT. The conductive conditions of the N11 and N10 at this time permit an electric current flowing from the output terminal OUT to the base of the transistor Q4 through N10, N13 and N12, and N11, thereby rendering the transistor Q4 conductive. As a result, a current flows from the output terminal OUT to the base of the transistor Q2 through the output transistor Q2, so as to increse the driving capability of the output transistor Q2, thereby improving the trailing edge characteristics of the output potential.

Now, description will be made as to a high impedance mode when the tri-state signal is in the low level condition.

When a low level tri-state signal is applied to the tri-state terminal T, the P-channel type transistor P3 is rendered conductive, thereby rendering P4 non-conductive while rendering N4 conductive. As a result, the transistor Q3 is rendered non-conductive, which renders the output transistor Q1 non-conductive.

On the other hand, when the tri-state signal is in the low level condition, P2 is rendered conductive, so that the transistor Q3 is rendered non-conductive even when the transistor Q4 is rendered conductive. As a result, both the transistors Q1 and Q2 are rendered non-conductive, thereby rendering the output terminal OUT in a high impedance condition.

In this manner as described above, when the output terminal OUT is in the high impedance condition, an electric current which tends to flow from the output terminal OUT to the power supply $V_{CC}$ through the resistor R3 and the base-collector forward direction diode of the transistor Q1 can be blocked, since the diode D1 is connected between one terminal of the current limiting resistor R2 and $V_{CC}$, the other terminal of resistor R2 being connected to the collector of the output transistor Q1, even when a voltage is applied to the output terminal OUT as the result of the ground level of the $V_{CC}$.

As described in the foregoing embodiment according to the present invention, the tri-state output circuit consists of an input section I which comprises the P-channel type FET and the N-channel type FET, an output section III which comprises bipolar transistors, and a control section II which comprises the P-channel type FET and N-channel type FET and which controls the switching functions of the output transistors of the output section III and high impedance conditions of the output terminal, whereby when the output terminal OUT is in the high level and low level conditions, the operating current can be reduced below than that of the TTL circuit construction while when the output terminal is in the high impedance condition, the current is substantially equal to that of the CMOS circuit construction, thereby reducing the power consumption.

Furthermore, since the output transistors Q1 and Q2 are formed by bipolar transistors in the tri-state output circuit according to the present invention, a high load driving capability, as well as high speed operation, can be realized. In addition, since a diode D2 is connected between the output terminal OUT and the ground, the undershoot phenomena of the output signal which otherwise occurs when an inductance component is connected to the output terminal OUT can be suppressed, thus alleviating the ringings of the output signal.

The effects of the tri-state output circuit according to the present invention are as follows;

Since the input section and the control section are comprised of the complementary type field effect transistors, and since tri-state output signals are obtainable by controlling the switching operations of the output transistors consisting of bipolar transistors and a high impedance condition at the output terminal through a control section, the output ringings can be suppressed, as well as achieving low power consumption, high load driving capability and high speed operation of the tri-state output circuit.

While the invention has been described in its preferred embodiment, it is to be understood that the words which have been used are words of description rather than of limitation and that various changes and modifications may be made within the purview of the appended claims without departing from the true scope and spirit of the invention in its broader aspects.

What is claimed is:

1. A tri-state output circuit which comprises:

(a) an input section having a NOR gate circuit receptive of an input signal and a tri-state signal for taking an inverse OR logical sum, and an invertor circuit receptive of the tri-state signal for producing an inverted signal thereof, each of said circuits consisting of a plurality of complementary field effect transistors;

(b) a control section having
        a first field effect transistor having a first conductivity type and a second field effect transistor having a second conductivity type, each of the gate terminals thereof being commonly connected to an output terminal of said invertor circuit, each of the source terminals thereof being connected to either a power supply or to a ground potential respectively,
        a third field effect transistor of said second conductivity type having its gate terminal being connected to an output terminal of the NOR gate circuit and its source being connected to the ground potential,
        a first electric current control circuit having a plurality of field effect transistors of said second conductivity type, coupled to said first, second, and third field effect transistors and
        a second electric current control circuit having a plurality of field effect transistors of said second conductivity type, each gate of said transistors being connected to either an input terminal or to the tri-state terminal respectively; and (c) an output section having first and second output transistors, and third and fourth transistors, said third transistor being Darlington-connected to said first output transistor, with its base terminal connected to one of the junction points of the first electric current control circuit, said fourth transistor being Darlington-connected to said second output transistor, with its base terminal connected to one of the junction points of the second electric current control circuit.

2. The tri-state output circuit as claimed in claim 1 wherein a specific type of a first diode and a current limiting resistor connected in series is provided between the power supply and the junction point of the collectors of the first and third transistors.

3. The tri-state output circuit as claimed in claim 1 wherein a specific type of a second diode is provided in parallel with the second transistor between an output terminal of the tri-state output circuit and the ground potential.

4. The tri-state output circuit as claimed in claim 1 wherein said first conductivity type is a P-channel type FET and said second conductivity type is a N-channel type FET.

5. The tri-state output circuit as claimed in claim 1 wherein said first electric current control circuit comprises fourth and fifth field effect transistors of the second conductivity type having their gate terminals connected to the input terminal, respectively, and sixth and seventh field effect transistors of the second conductivity type having their gate terminals connected to the tri-state terminal, respectively, said fourth and seventh field effect transistors as well as said fifth and sixth field effect transistors being connected in series, while said fourth and sixth field effect transistors as well as the fifth and seventh field effect transistors being connected in parallel with each other.

6. The tri-state output circuit as claimed in claim 1 wherein said second electric current control circuit comprises fourth and fifth field effect transistors of the second conductivity type having their gate terminals connected to the input terminal, respectively, and sixth and seventh field effect transistors of the second conductivity type having their gate terminals connected to the tri-state terminal, respectively, said fourth and seventh field effect transistors as well as said fifth and sixth field effect transistors being connected in series, while said fourth and sixth field effect transistors as well as the fifth and seventh field effect transistors being connected in parallel with each other.

7. The tri-state output circuit as claimed in claim 1 wherein said complementary field effect transistors are P-channel conductivity type and N-channel conductivity type FET transistors.

8. The tri-state output circuit as claimed in claim 1 wherein said second, third, and fourth transistors of the output section are Schottky barrier NPN transistors respectively.

9. The tri-state output circuit as claimed in claim 2 wherein said first and second diodes are Schottky barrier type diodes.

10. The tri-state output circuit as claimed in claim 3 wherein said first and second diodes are Schottky barrier type diodes.

* * * * *